(12) United States Patent
Chiang

(10) Patent No.: US 6,700,077 B2
(45) Date of Patent: Mar. 2, 2004

(54) PACKAGING SUBSTRATE WITH ELECTROSTATIC DISCHARGE PROTECTION

(75) Inventor: Juang-Sheng Chiang, Kaohsiung Hsien (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/164,356

(22) Filed: Jun. 6, 2002

(65) Prior Publication Data

US 2002/0185305 A1 Dec. 12, 2002

(30) Foreign Application Priority Data

Jun. 7, 2001 (TW) .......................... 90113824 A

(51) Int. Cl.⁷ ........................ H05K 1/11; H01R 12/04
(52) U.S. Cl. .................. 174/262; 174/260; 174/261; 174/266; 361/760; 361/807; 257/787
(58) Field of Search .................. 174/260, 262, 174/266, 255, 52.4, 250, 261; 361/760, 764, 783, 792, 794, 795, 799, 803, 807; 257/698, 778, 787, 700, 737

(56) References Cited

U.S. PATENT DOCUMENTS

| | | | | |
|---|---|---|---|---|
| 5,635,671 A | * | 6/1997 | Freyman et al. | 174/52.2 |
| 5,715,143 A | * | 2/1998 | McHugh et al. | 361/749 |
| 5,982,625 A | * | 11/1999 | Chen et al. | 361/748 |
| 6,013,947 A | * | 1/2000 | Lim | 257/685 |
| 6,111,324 A | * | 8/2000 | Sheppard et al. | 257/787 |
| 6,246,015 B1 | * | 6/2001 | Kim | 174/261 |
| 6,278,618 B1 | * | 8/2001 | Lee et al. | 361/820 |
| 6,309,916 B1 | * | 10/2001 | Crowley et al. | 438/127 |
| 6,469,258 B1 | * | 10/2002 | Lee et al. | 174/261 |

* cited by examiner

Primary Examiner—Kamand Cuneo
Assistant Examiner—I B Patel
(74) Attorney, Agent, or Firm—Ladas and Parry

(57) ABSTRACT

The present invention relates to a packaging substrate with electrostatic discharge protection. Each of the mold gates on the substrate is electrically connected to the first copper-mesh layer on the periphery of a top side of the substrate. When static electricity is generated during the molding process, static electric charges will be conducted from the mold gate to the first copper-mesh layer. The static electric charges are collected and restricted to a capacitor formed by a first copper-mesh layer, a dielectric layer and a second copper-mesh layer, and are discharged via a metal pad and supporter. On the other hand, the static electric charge is conducted via the first copper-mesh layer, a through hole, the second copper-mesh layer, the metal pad to the supporter. Therefore, basing on capacitor effects or conductive effects, the static electricity generated during the molding process can be safely conducted away from the substrate, preventing the dies to be packaged from damage due to electrostatic discharge so as to raise the yield rate of semiconductor package products.

3 Claims, 4 Drawing Sheets

PACKAGING SUBSTRATE WITH ELECTROSTATIC DISCHARGE PROTECTION

BACKGROUND OF THE INVENTION

1. Field of the Invention

The present invention relates to a packaging substrate, more particularly, to a packaging substrate with electrostatic discharge protection.

2. Description of the Related Art

The working voltage of an integrated circuit is typically of 5 volts or less. When the integrated circuit is applied with relatively higher voltage, the integrated circuit will usually be damaged. Static electricity is generated from friction, induction and contact; but the popularly used chips are rarely designed with a circuit for electrostatic discharge protection to safeguard against damage to chips from static electricity. Most chips are not equipped with such an electrostatic protective circuit.

In addition, during the process for packaging or molding the dies, when the mould compound is injected to package the die, static electricity will be generated from the friction, induction and contact between the mould compound and substrate or other medium. The electrostatic discharge will damage the die and fail the semiconductor package products.

Therefore, it is necessary to provide an innovative and advanced packaging substrate so as to solve the above problem.

SUMMARY OF THE INVENTION

One objective of the present invention is to provide a packaging substrate with electrostatic discharge protection. Each of the mold gates on the substrate is electrically connected to a first copper-mesh layer on the periphery of a top side of the substrate. When static electricity is generated during the molding process, static electric charges will be conducted from the mold gate to the first copper-mesh layer. The static electric charges are collected and restricted to a capacitor formed by the first copper-mesh layer, a dielectric layer and a second copper-mesh layer, and are discharged via a metal pad and supporter. Therefore, basing on capacitor effects, the static electricity generated during the molding process can be safely conducted away from the substrate, preventing the dies to be packaged from damage due to electrostatic discharge so as to raise the yield rate of semiconductor package products.

Another objective of the present invention is to provide a packaging substrate with electrostatic discharge protection. The packaging substrate utilizes a through hole, that goes through the first copper-mesh layer and the dielectric layer to the second copper-mesh layer, and electrically connected die first copper-mesh layer and the second copper-mesh layer. When static electricity is generated during the molding process, static electric charges will be conducted from the mold gate to the first copper-mesh layer, and will be conducted via the first copper-mesh layer, the through hole, the second copper-mesh layer, the metal pads to the supporter. Therefore, by the conductive effects, the static electricity generated during the molding process can be safely conducted away from the substrate, preventing the dies to be packaged from damage due to electrostatic discharge so as to raise the yield rate of semiconductor package products.

DETAILED DESCRIPTION OF THE INVENTION

Figure 1:
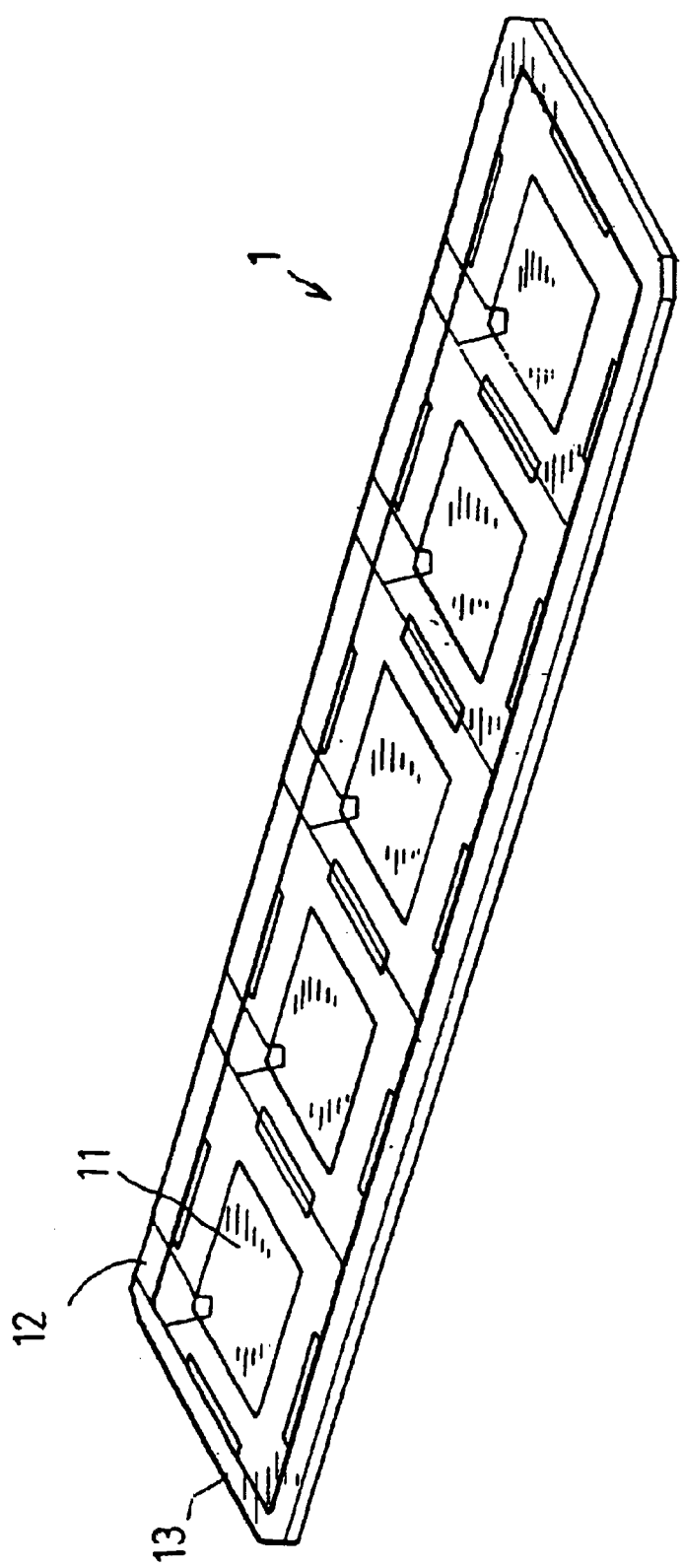
FIG. 1 is a perspective view of a first embodiment of the packaging substrate according to the invention.
Figure 2:
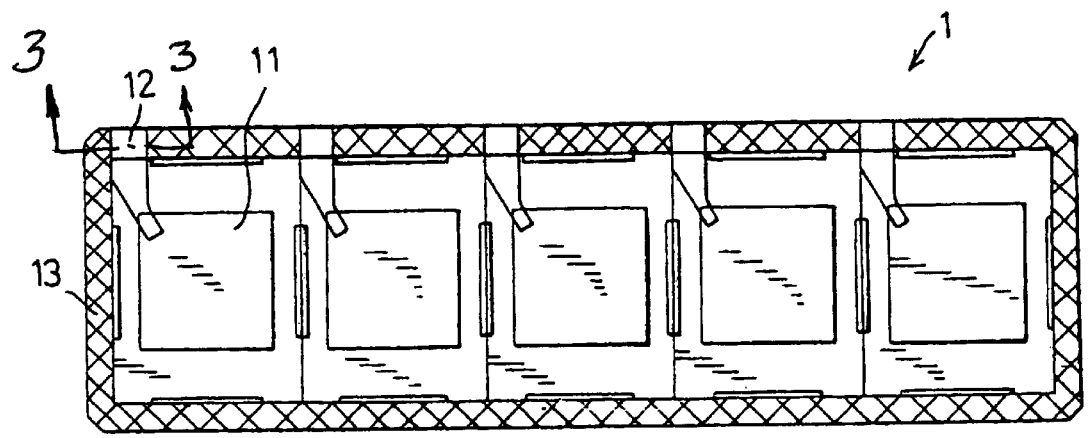
FIG. 2 is a top-view of the first embodiment of the packaging substrate according to the invention with a top layer removed.
Figure 3:
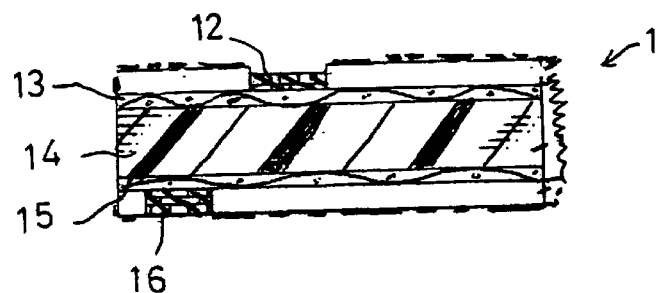
FIG. 3 is an enlarged cross-sectional view on line 303 in FIG. 2 of a left-end portion of the first embodiment of the packaging substrate according to the invention with the top and a bottom layer removed.

Referring to FIGS. 1, 2 and 3, according to the first embodiment of the invention a packaging substrate 1 with electrostatic discharge protection comprises: five die pads 11, five mold gates 12, a first copper-mesh layer 13, a dielectric layer 14, a second copper-mesh layer 15 and a metal pad 16. The die pad 11 supports the die. Each mold gate 12 is connected to each die pad 11 by the periphery of the packaging substrate 1 and through which the mould compound is injected into the die pads 11. The mold gates 12 are at the top side of the packaging substrate 1. The metal pads 16 are at the bottom side of the packaging substrate 1.

The first copper-mesh layer 13 is formed on the periphery of the packaging substrate 1 and is electrically connected to the mold gates 12. As shown in FIG. 3, along the periphery of the packaging substrate 1, the first copper-mesh layer 13 is formed below the mold gate 12 and is electrically connected to the mold gate 12.

Figure 6:
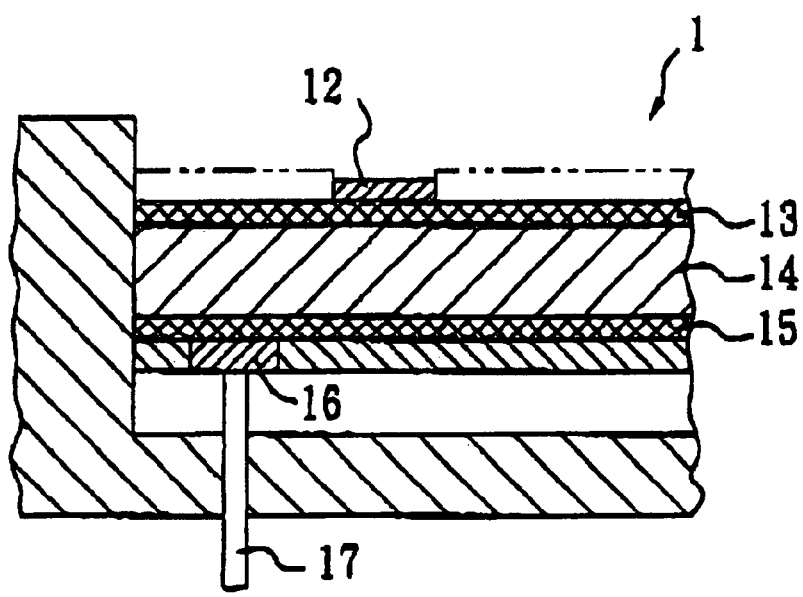
FIG. 6 is a cross-sectional view of the left-end portion of FIG. 3 on a supporter.

The second copper-mesh layer 15 is formed on the periphery of the bottom side of the packaging substrate 1. The dielectric layer 14 is formed between the first copper-mesh layer 13 and the second copper-mesh layer 15. The metal pad 16 is formed below the second copper-mesh layer 15, and is electrically connected to the second copper-mesh layer 15 on the periphery of the bottom side of the packaging substrate 1. The metal pad 16 contacts and electrically connects to a supporter 17 (FIG. 6) for supporting the packaging substrate 1.

As shown in FIG. 3, the first copper-mesh layer 13, the dielectric layer 14 and the second copper-mesh layer 15 form a capacitor. When the die is being packaged or molded, if the mould compound and the packaging substrate 1 and other medium produce friction, induction and contact that generates static electricity, such static electric charge will be conducted from the mold gate 12 to the first copper-mesh layer 13; the static electric charge is collected and restricted to the capacitor formed by the first copper-mesh layer 13, the dielectric layer 14 and the second copper-mesh layer 15, and is discharged via the metal pad 16 and the supporter. Therefore, by using the packaging substrate 1 of the invention, the static electricity generated during packaging process can be safely conducted away from the packaging substrate 1, preventing the dies to be packaged from damage due to electrostatic discharge so as to raise the quality of semiconductor package products.

Figure 4:
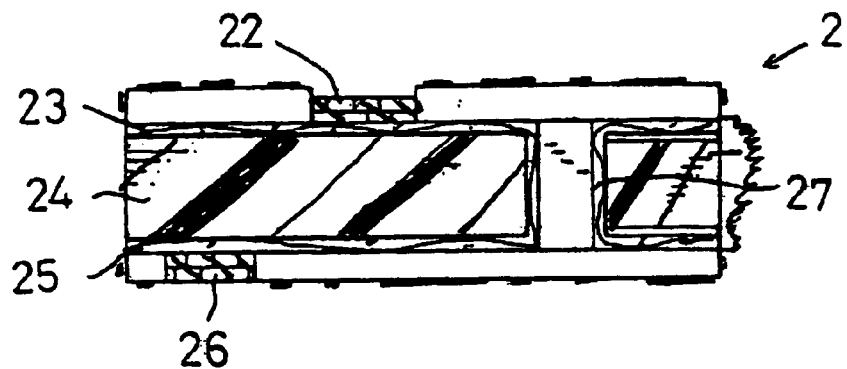
FIG. 4 is an enlarged cross-sectional view of a left-end portion of a second embodiment of the packaging substrate according to the invention with top and bottom layers removed.

Referring to FIG. 4, according to the second embodiment of the invention, the packaging substrate 2 with electrostatic discharge protection and the packaging substrate 1 of the first embodiment both comprise: die pads (not shown in the figure), mold gates 22, a first copper-mesh layer 23, a dielectric layer 24, a second copper-mesh layer 25 and a metal pad 26. Its configurations and layout are generally similar to those in the first embodiment of the packaging substrate 1.

The second embodiment of the packaging substrate 2 with the electrostatic discharge protection further comprises a through hole 27, which goes through the first copper-mesh layer 23 to the dielectric layer 24 and through to the second copper-mesh layer 25, and electrically connects to the first copper-mesh layer 23 and the second copper-mesh layer 25. When the die is being packaged or molded, the static electricity will be generated, such static electric charges are conducted via the mold gate 22 to the first copper-mesh layer 23, and via the through hole 27, die second copper-mesh layer 25 and metal pad 26 to the supporter. Therefore, the packaging substrate 2 of the second embodiment uses the conductive effect to safely discharge static electricity from the packaging substrate 2.

Figure 5:
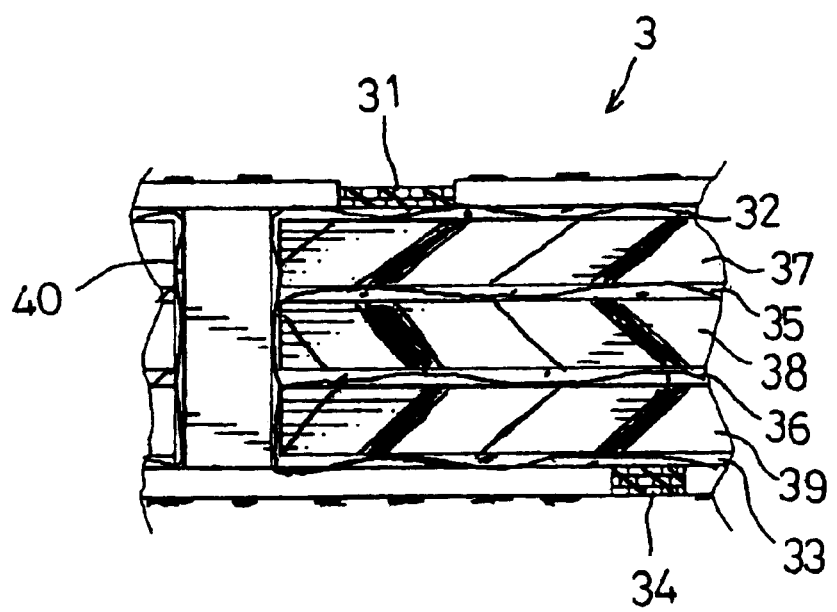
FIG. 5 is an enlarged cross-sectional view of a left-end portion of a third embodiment of the packaging substrate according to the invention with top and bottom layers removed.

Referring to FIG. 5 the packaging substrate with electrostatic discharge protection can be used on multi-layer Ball Grid Array (BGA). The third embodiment of the packaging substrate 3 with electrostatic discharge protection of this invention comprises; die pads (not shown in the figure), mold gate 31, a first copper-mesh layer 32, a second copper-mesh layer 33 and a metal pad 34; but the packaging substrate 3 further comprises a plurality of middle copper-mesh layers and a plurality of middle dielectric layers. The middle copper-mesh layers comprise a third copper-mesh layer 35 and a fourth copper-mesh layer 36, which are averagely placed between the first copper-mesh layer 32 and the second copper-mesh layer 33. The middle dielectric layers comprise dielectric layers 37, 38 and 39. The various middle copper-mesh layers are sandwiched with dielectric layers 37, 38 and 39, and are penetrated by a through hole 40 that electrically connects to such middle copper-mesh layers. In the other word, each middle copper-mesh layer and each middle dielectric layer are alternately formed between the first copper-mesh layer and the second copper-mesh layer. Similarly, by using conductive effect, the packaging substrate 3 can be safety discharged from static electricity.

While an embodiment of the present invention has been illustrated and described, various modifications and improvements call be made by those skilled in the art. The embodiment of the present invention is therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A packaging substrate with electrostatic discharge protection, comprising:

a top side and a bottom side;

at least one die pad for supporting a die, at least one mold gate formed at the top side of the substrate, each mold gate extending from an edge of the substrate to the die pad to inject mould compound into the die pad;

a first copper-mesh layer formed on the periphery of the top side of the substrate, the first copper-mesh layer electrically connected to the mold gate;

a second copper-mesh layer formed on the periphery of the bottom side of the substrate;

a dielectric layer formed between the first copper-mesh layer and the second copper-mesh layer;

at least one metal pad formed on the periphery of the bottom side of the substrate and electrically connected to the second copper-mesh layer, the metal pad contacting and electrically connected to a supporter for supporting the substrate;

whereby, when static electricity is generated during the molding process, static electric charges are conducted via the mold gate to the first copper-mesh layer and then discharged via the supporter.

2. The packaging substrate according to claim 1, further comprising at least one through hole, penetrating the first copper-mesh layer, the dielectric layer and the second copper-mesh layer, and electrically connected the first copper-mesh layer and the second copper-mesh layer so that the static electric charges are conducted via the first copper-mesh layer, the through hole, the second copper-mesh layer and the metal pads to the supporter.

3. The package substrate according to claim 2, further comprising a plurality of middle copper-mesh layers and a plurality of middle dielectric layers, each middle copper-mesh layer and each middle dielectric layer alternately formed between the first copper-mesh layer and the second copper-mesh layer, the middle copper-mesh layers electrically connected via at least one through hole.

* * * * *